United States Patent [19]

Popelish

[11] 4,400,613

[45] Aug. 23, 1983

[54] TEMPERATURE CONTROLLER FOR A FUSING ROLLER

[75] Inventor: John A. Popelish, Waynesboro, Va.

[73] Assignee: General Electric Company, Waynesboro, Va.

[21] Appl. No.: 174,475

[22] Filed: Aug. 1, 1980

Related U.S. Application Data

[63] Continuation of Ser. No. 965,880, Dec. 4, 1978, abandoned.

[51] Int. Cl.³ .................................................. A05B 1/02
[52] U.S. Cl. .................................. 219/497; 219/492; 219/216; 323/236; 307/252 UA
[58] Field of Search ............... 219/497, 505, 216, 494, 219/485, 508, 509, 501; 323/235, 236, 319; 307/117, 252 UA; 363/50, 55, 56

[56] References Cited

U.S. PATENT DOCUMENTS

| | | | |
|---|---|---|---|
| 3,651,753 | 3/1972 | Schmidt | 323/236 |
| 3,806,784 | 4/1974 | Findlay | 323/236 |
| 3,813,516 | 5/1974 | Kudsi et al. | 219/216 |
| 3,878,358 | 4/1975 | Barton et al. | 219/497 |
| 3,946,199 | 3/1976 | Nakamura | 219/216 |
| 4,029,937 | 6/1977 | Russell | 219/501 |
| 4,046,991 | 9/1977 | Sefton et al. | 219/497 |
| 4,093,847 | 6/1978 | Walker et al. | 219/501 |
| 4,097,723 | 6/1978 | Leitner et al. | 219/494 |
| 4,104,715 | 8/1978 | Lawson, Jr. | 363/56 |

OTHER PUBLICATIONS

Zero Voltage Switching for Proportional Temperature Control by Brookmire, EEE Circuit Design Engineering, pp. 96–98, 4-1967.

*Primary Examiner*—M. H. Paschall
*Attorney, Agent, or Firm*—Michael Masnik

[57] ABSTRACT

Apparatus for controlling the cycles of AC power supplied to a variable thermal load in response to analog signals representing the temperature of the load comprising means for quantizing the analog signals into digital signals and controlling the proportion of integral cycles of AC current blocked to those supplied to said load, while providing a uniform spacing in time of the integral cycles supplied, in accordance with said digital signals. Also means are provided for modifying said digital signals in response to a predetermined average current overload.

8 Claims, 8 Drawing Figures

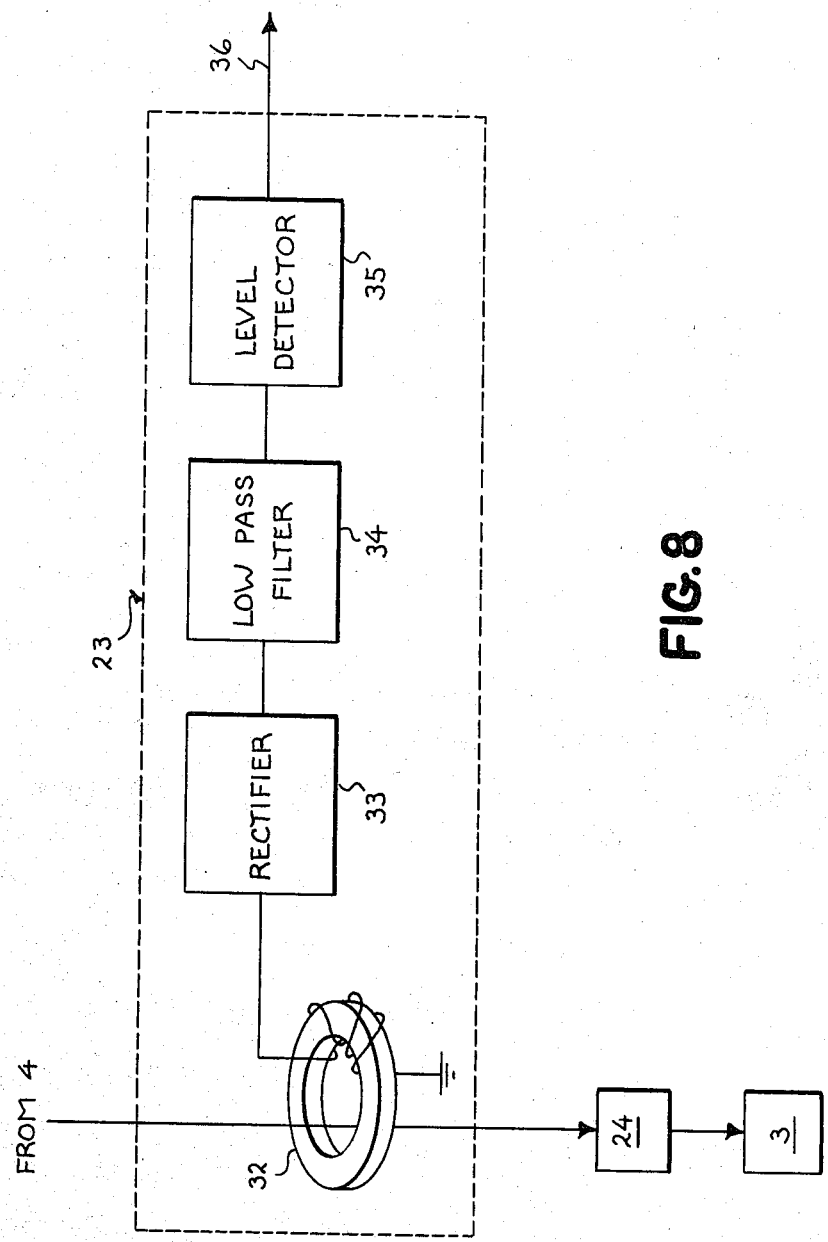

TEMPERATURE CONTROLLER FOR A FUSING ROLLER

This is a continuation of application Ser. No. 965,880, filed Dec. 4, 1978, now abandoned.

BACKGROUND OF THE INVENTION

This invention relates, in general, to heated fusing roller apparatus for affixing toner material to a substrate to form permanent images thereon and, more particularly, to means for controlling the power input to the heated roller for maintaining substantially constant the surface temperature of the heated roller at an area where it contacts the toner material.

In the process of electrostatic or magnetic printing, information is typically recorded in the form of a latent electrostatic or magnetic image on a recording member with subsequent rendering of the latent image visible by the application of electrostatic and/or magnetic marking particles, commonly referred to as toner. The visual image can be either fixed directly upon the recording member or transferred from the member to a sheet of plain paper with subsequent affixing of the image thereto.

In order to permanently affix or fuse a toner material onto a record medium, such as paper, it is necessary to elevate the temperature of the toner material to a point at which the constituents of the toner material coalesce and become adhesive. This action causes the toner to be absorbed to some extent into the fibers of the record medium. Pressure is sometimes used to increase the adhesive. Thereafter, as the toner material is cooled, solidification of the toner material occurs causing the toner material to be firmly bonded to the record medium.

In both the electrostatic and magnetic printing arts, the use of thermal energy for fixing toner images onto a support member is old and well-known.

One approach to thermal fusing of toner images onto a record medium has been to pass the record medium with the toner images thereon between a pair of opposed rollers, at least one of which is either externally or internally heated. In this type of arrangement, the toner image contacts the surface of the heated roller member in the nip between rollers to thereby produce heating of the toner image within the nip.

In apparatus utilizing a fuser roller pair as described above, it is important that the heated roller surface be maintained within a suitable range to properly fuse the toner image to its record medium. A conventional manner for accomplishing the foregoing is by the employment of a temperature sensitive device which is coupled to the heated roller and whose output controls the heat source. A suitable arrangement is described in my co-pending application entitled "Non-Contact Temperature Sensor For a Fusing Roller" filed concurrently with this application and assigned to a common assignee. Where AC power is involved the output either switches power on or off completely until the roller temperature reaches a desired level or switches different partial cycles of power as by an SCR until the desired temperature level is reached.

These prior art arrangements have exhibited shortcomings. Some of these have produced overshoots and undershoots of temperature beyond the desired narrow range of desirable temperatures. Others have generated objectionable high frequency noise or DC components in the power line, peak power requirements, transients, etc.

Accordingly, it is a primary object of this invention to provide a new and improved method and apparatus for controlling the heat used to fuse toner images to the record medium.

Another object of this invention is to provide an improved arrangement for controlling the temperature of rotating rollers or other machinery.

Still another object of the present invention is to provide a new and improved arrangement for controlling the temperature of the heated fuser roller in a toner imaging system.

Yet another object of this invention is to provide a new and improved control circuit for controlling electrical energy supplied to a thermal servo system load.

A BRIEF DESCRIPTION OF THE INVENTION

In accordance with one embodiment of the invention applicable to temperature control of a thermal load, such as a fuser roller in a magnetic printer, there is provided a temperature sensor for providing analog signals representing the temperature of the fuser roller.

Apparatus is provided for controlling the cycles of AC power applied to the load in response to the analog signals comprising means for quantizing the analog signals into digital signals and controlling the proportion of integral cycles of AC current blocked to those supplied to the load, while providing a uniform spacing in time of the integral cycles supplied over a predetermined control period in which a substantial portion of integral cycles of alternating current occur, in accordance with the digital signals. Means are also provided for modifying said digital signals in response to a predetermined average current overload.

Other objects of this invention, together with additional features contributing thereto and advantages accruing therefrom, will become readily apparent from the following description of the preferred embodiment of the invention when read in conjunction with the accompanying drawings wherein:

FIG. 8 illustrates the details of the line current sensing system shown in FIG. 4.

DETAILED DESCRIPTION OF THE INVENTION

Figure 1:
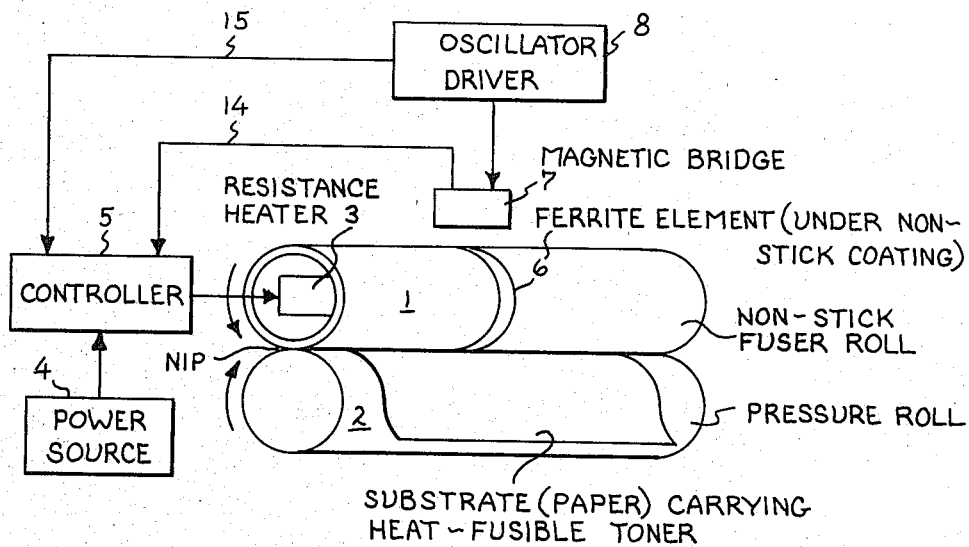
FIG. 1 is a pictorial view of a toner sealing mechanism for an automatic electrostatic or magnetic printing apparatus utilizing the present invention.

Referring now to FIG. 1, there is shown an embodiment of the subject invention as applied in a magnetic printing system wherein latent magnetic images are produced on a magnetic medium such as an endless belt of magnetic tape and the latent magnetic images are developed with toner particles which are then transferred to a record medium such as paper. In a printer application the latent images would be descriptive of, for example, alpha and numeric information available from a keyboard or from a communication line. In order to provide a permanent record, it is desirable that the toner developed images transferred to the record medium are permanently fused to that record medium. In this connection shown in FIG. 1, a pair of rollers 1 and 2 are provided. The two rollers driven by an external source such as a motor, not shown, cooperate with one another to form a nip therebetween through which a substrate such as paper, supporting toner material, is moved. As shown in FIG. 1, roller 1 is heated by a resistance heater 3 such as a quartz lamp. In the embodiment shown, the heater derives electrical energy from source 4 under the control of a controller 5 which shall be described in greater detail shortly. The surface temperature of roller 1 must be maintained within a very narrow range of the order of 20° F. typically centered at 330° F. to render the toner particles adhesive enough to cling to the paper but not hot enough to melt them to a liquid which would leave a residue clinging to the roller and affecting subsequent paper passing between the rollers. To achieve this, therefore, the electrical energy supplied to resistance heater 3 has to be controlled very closely. In order to achieve this degree of control, it is necessary to measure or monitor the temperature of the surface of roller 1 very accurately. In order to monitor the surface temperature of roller 1, applicant inserts a ferromagnetic material as a band 6 completely surrounding the roller. Chemical composition of the material is selected to have a curie temperature range which corresponds to range of temperature to be maintained.

Figure 2:
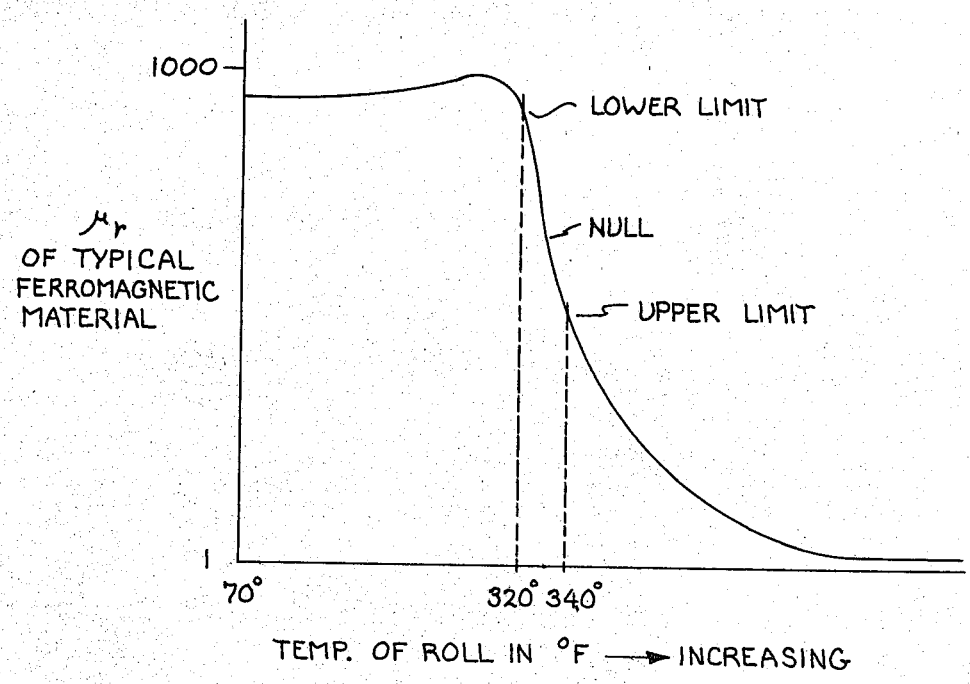
FIG. 2 illustrates graphically certain features useful in explaining the present invention.

Referring to FIG. 2, there is shown a characteristic curve for curie point material operating in the embodiment of the present invention. In FIG. 2 the magnetic relative permeability which is a dimensionless number is plotted as the ordinate and the temperature of the material is plotted as the abscissa. As shown, the permeability of the material is in the order of 1000 for all temperatures starting from room temperature 70° F. up to some point near a control point where the permeability of the material drops rapidly through a range which includes the temperature control range. As previously mentioned in a particular embodiment, this temperature control range was of the order of 20° F. centered on 330° F. While the invention has been described in connection with a particular temperature control range in mind, it is obvious that this range can be changed depending on the application desired. FIG. 2, therefore, illustrates that it is desired to control the temperature of the heating element for roller 1 within the narrow temperature range of 20° F. To achieve this, applicant makes use of an alternating magnetic field bridge having the curie material included in one arm of said bridge. As shown in FIG. 1 the magnetic bridge is energized by an oscillator driver 8 which in a particular application provided 3 kilocycle signals to the bridge. The output of the bridge representative of the permeability of the material as it changes with temperature and hence the representative of the surface temperature of roller 1 constitutes an input signal to controller 5 for controlling the amount of electrical energy being supplied by source 4 to the heater 3 to maintain the temperature of the surface of the roller within the desired limits.

Figure 3:
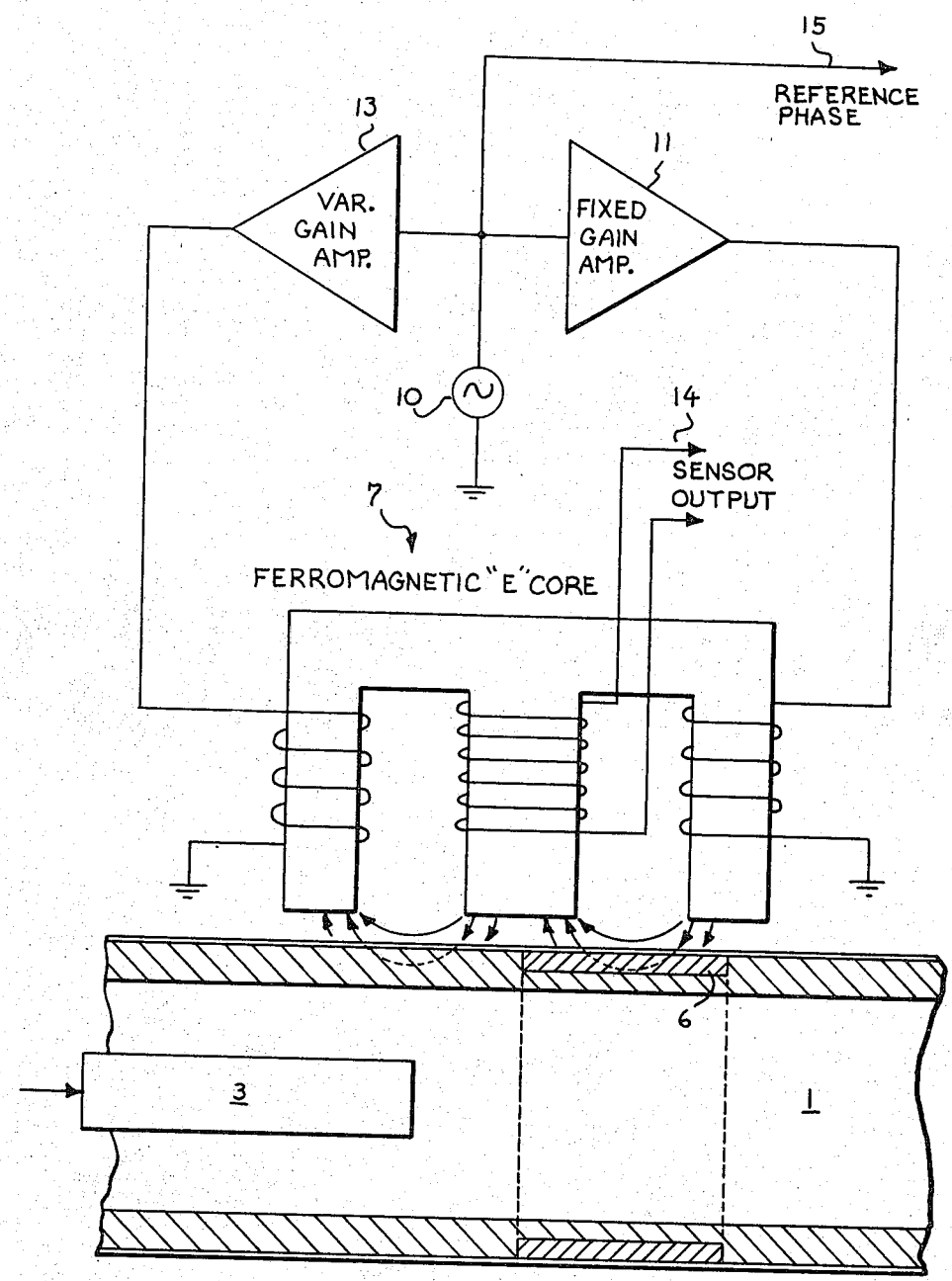
FIG. 3 is schematic, partly in section, of a curie point temperature sensing system incorporated in the apparatus of FIG. 1.

Referring to FIG. 3, there is shown in greater detail the nature of the magnetic bridge with the roller 1 shown in cross section. Roller 1 comprises an aluminum cylindrical core coated with a thin, elastomeric, non-stick coating. Bridge 7 in a particular embodiment comprises an E core of ferromagnetic material in which the reference winding energizes one arm of the bridge from signals applied from oscillator 10 via amplifier 11. The opposite arm of the bridge is energized from the source 10 through a variable gain inverting amplifier 13. Inverting amplifier 13 is such that the windings 9 and 12 are energized with 3 kilohertz signals which are 180° out of phase. The gain of the variable gain amplifier 13 is adjusted such that the bridge passes through null at the center of the temperature or permeability control range. One of the arms of the bridge includes the roller 1 without the ferrite material, that is containing in a particular embodiment only aluminum which exhibits an essentially constant permeability with temperature change and the other arm includes the portion of the roller 1 carrying the ferrite material 6 embedded in a surface which has a permeability which varies with the temperature of the surface of the roller. The magnetic fields established between the arms of the bridge and the fuser roller are illustrated for one particular instant by the arrows. Since the ferromagnetic material was selected to have its steepest permeability changes in the range of the temperature control range, the bridge produces signals on its output leads 14 which essentially represents the temperature of the roller in the desired control range. The signals developed on the output leads 14 are of 3 kilohertz value and having a phase which varies with respect to the phase of the signals from source 10 available on leads 15 in accordance with the change in permeability of the ferrite material 6 and hence of the temperature of the surface of the roller 1. Controller 5 in FIG. 1 responds to the relative phase of the signals available on 14 from the bridge and 15 from the reference source 10 to control the electrical energy available from source 4 to the heater 3. The controller to be described shortly performs several complex functions necessary to maintain the surface temperature of the roller within the prescribed temperature range while at the same time minimizing the adverse impact on the power source 4 as a result of the characteristics of the heater element 3. For example, in a particular embodiment the heater element was a quartz lamp which had a maximum power output of 2000 watts when provided with power from 120 volts 60 cycle source. With this power output, the lamp can raise the surface temperature of the fuser roller 1 to a level which will soften the toner and cause proper adhesion of the toner to the record medium or paper. It should be noted that in a high speed printer application a considerable amount of heat energy has to be supplied to the fuser roller since the heat energy is being carried away rapidly by the paper moving therethrough. In a particular application where the paper moved at about 16 inches per second, a high power quartz lamp was required and this lamp had to be operated near its maximum limit. When such a high power lamp is initially energized, a current surge develops, typically six times normal heating current due to the large positive temperature coefficient of resistance of the lamp filament. In a usual application this amount of surge current would open the fuses or require an oversized power source. To minimize this surge current, it is necessary to allow the filament to warm up slowly by applying widely spaced individual cycles of the current thereto. Also since the typical lamp current is near the source limit, a current detector is included to delete cycles to limit the full power current as it approaches an acceptable maximum. Random switching this large amount of power in an application such as involving a printer connected to normal AC service would produce high frequency noise or DC components in the power line circuit which would exceed acceptable limits. To overcome these problems, applicant provides an arrangement to control the applied power as integral cycles rather than applying fractional parts of line frequency. Power is therefore controlled in full integral cycle increments. This involves switching at the zero crossings of the line voltage. In order to avoid multiple cycle surges during the cycle switching, the arrangement to be described distributes the power cycles evenly in time over a predetermined control period in which a substantial portion of integral full cycles of alternating current from said source occur, as the proportion of cycles blocked to cycles passed is varied in accordance with the energy requirements of the fuser roller 1.

Figure 4:
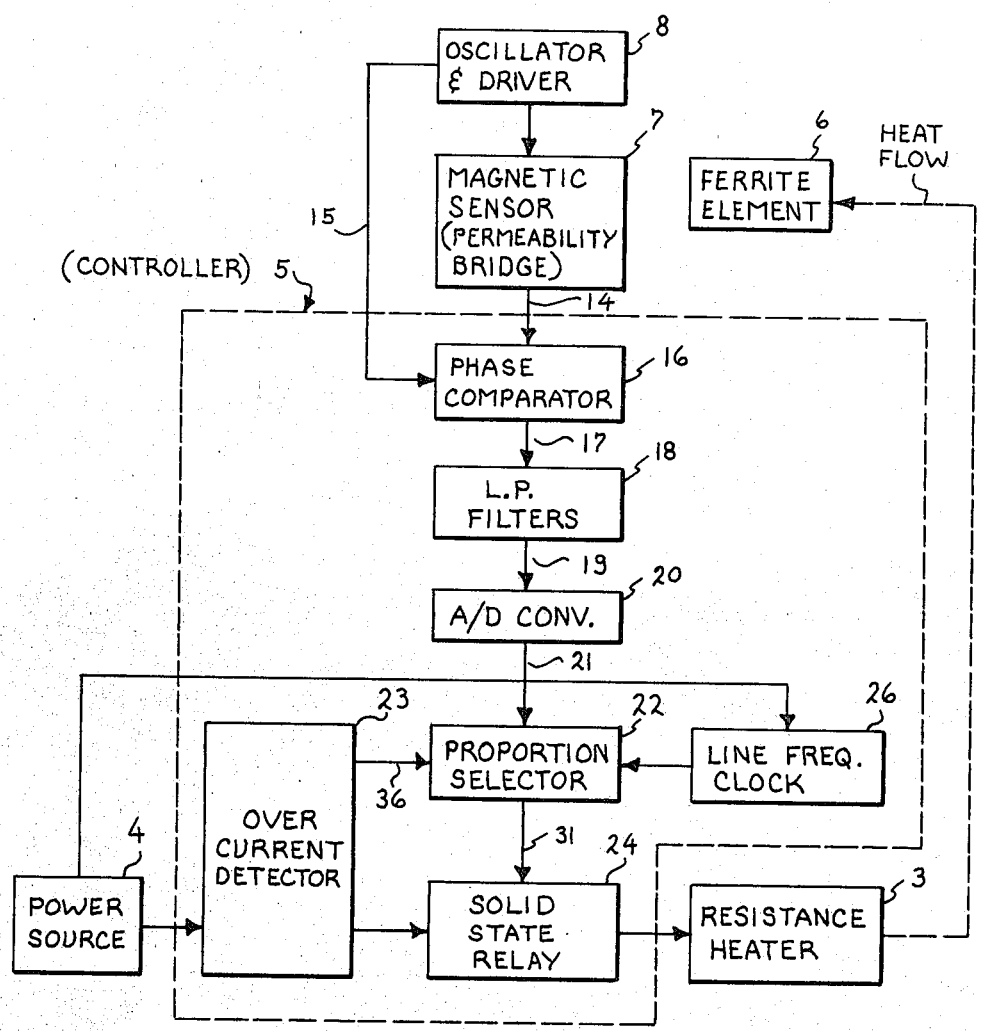
FIG. 4 is a block diagram of a fuser control used in conjunction with the fuser apparatus illustrated in FIG. 1.
Figure 5:
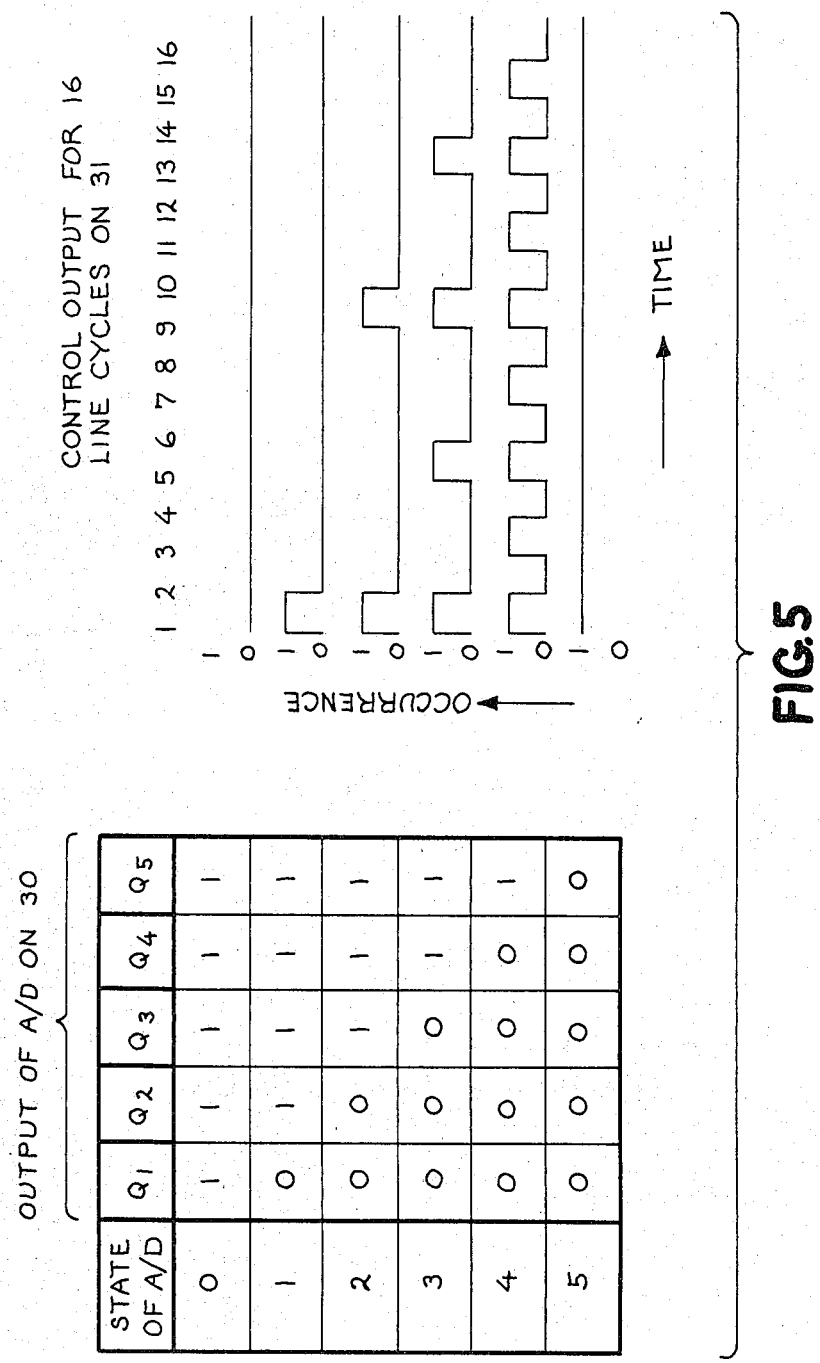
FIG. 5 is waveforms illustrating certain aspects of the operation of the present invention.
Figure 6:
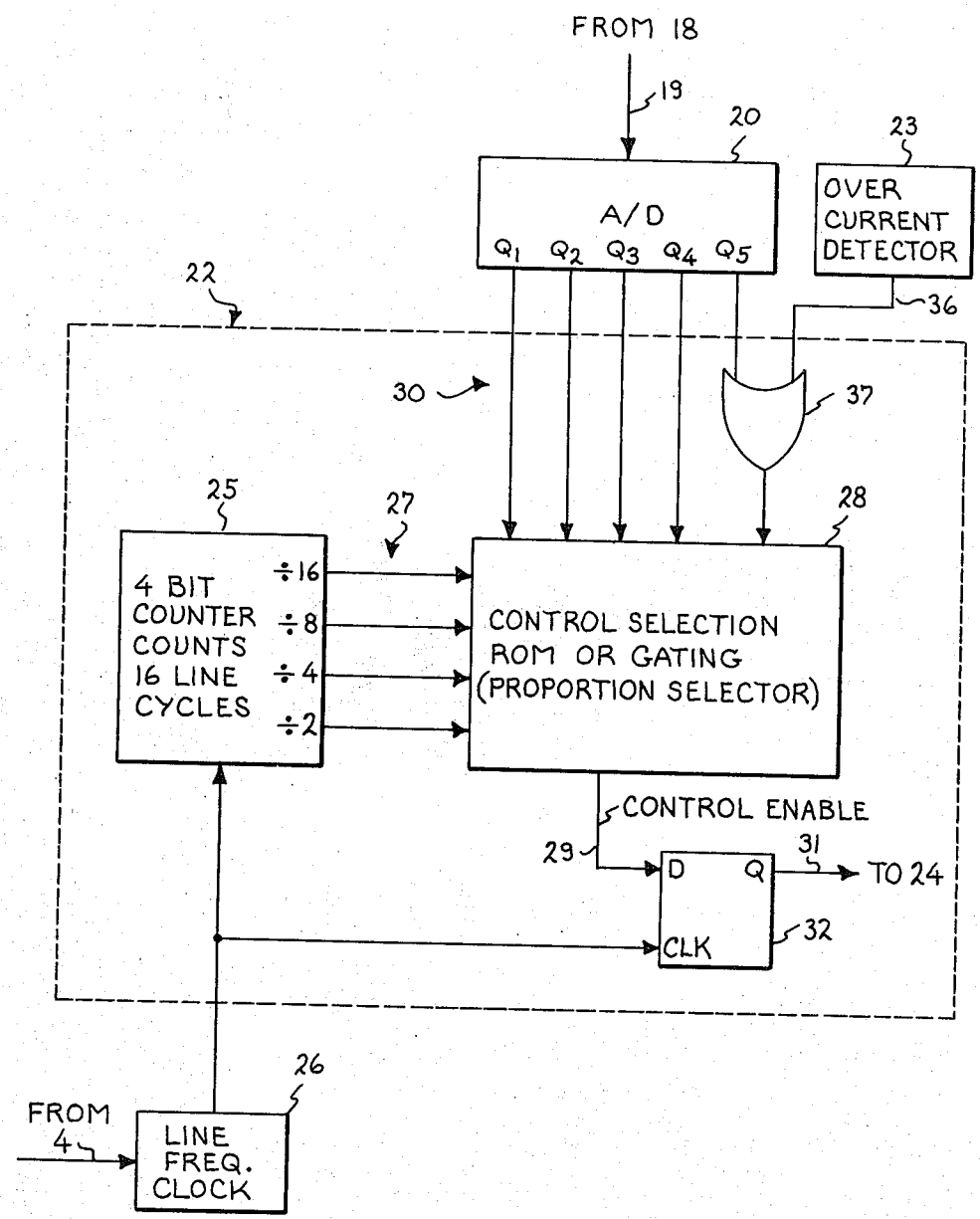
FIG. 6 illustrates in greater detail certain blocks illustrated in FIG. 4.

Referring to FIG. 4, a phase comparator 16 responds to the difference in phase between the signals available on leads 14 and 15 to produce an output signal on lead 17 indicative of the difference in phase between the applied input signals. In a particular embodiment the signals on 14 and 15 were 3 kilohertz sine waves. These 3 kilohertz input signals are first prepared by amplification and limiting to produce square waves which are combined in an exclusive OR gate as digital pulses. When these processed pulses are in the same state, the output of comparator 16 is at a logic 0 state and if they are not in the same state, then they produce a second state output signal which is at a logic 1. This circuit is a well known circuit and for further details reference should be made to the RCA solid state handbook entitled "COS/MOS Integrated Circuits" dated 1977 wherein an exclusive OR network operating as a phase comparator is described on page 612. The output of comparator 16 is level 1 or level 0 signals for various amounts of time depending upon the relative phases of the signals available on leads 14 and 15. The purpose of circuit 18 is to convert the variable duty cycle pulse train available on 17 to a DC signal by low pass filtering. The DC signal, therefore, on lead 19 is indicative of the temperature of the surface of the fuser roller 1. The function of block 20 is to convert the analog signal on 19 to a digital signal in form of a binary code representing the quantized value of the DC signal available on 19. Essentially, circuit 20 senses five discrete DC levels and produces a binary code on lead 21. The A to D converter 20 is a common circuit and will not be described in detail. Reference can be made to Texas Instruments' integrated circuit TL489. Reference can be made now to FIG. 5 wherein the output of the A to D converter in the form of a five bit code is shown. The converter has six possible output states which span the range of analog signals available on 19. The 0 state represents the upper limit of the temperature control range shown in FIG. 2 and the state 5 represents the lower limit of the temperature control range. The proportion selector 22 functions to delete the desired integral number of power cycles being supplied from the power source 4 to the resistance heater 3 through a current detector 23 and solid state relay 24 to the resistance heater 3. As previously mentioned, the function of the selector 22 is to control solid state relay 24 so that it only supplies full or integral cycles of power and that the cycles passed are uniformly distributed in time. Referring to FIG. 6 the further details of the selector 22 are shown. Essentially, this involves a four bit counter 25 which counts the clock pulses available from source 26 and develops a binary number representative of the sequential counting from 1 to 16 constituting the sample or predetermined control period on the leads 27 applied to gates 28. The inputs to leads 27 are representative of the counted line cycles. The particular line cycles selected for passage to heater 3 are communicated to lead 29 in accordance with the states of the signals available on lead 30 from the A to D converter 20. Referring to FIG. 5 again therefore, it is seen that for the 0 state no integral or full cycles of the 16 counted cycles is passed to the output lead 31. For the first state only the first cycle is passed. For the second state only the first and ninth cycles are passed and so forth. For the fourth state alternate cycles are passed and for the fifth state the power is passed continuously for all cycles. Flip-flop 32 assures that only one on-off decision can be made per cycle. Flip-flop 32 is a standard D type flip-flop. This decision is conveyed by a signal developed on lead 31 for coupling to 24. These variations in duty cycle represents the various amounts of average power to be delivered from source 4 to the resistance heater 3 to maintain the temperature of the roller 1 within the desired range under varying load conditions.

Figure 7:
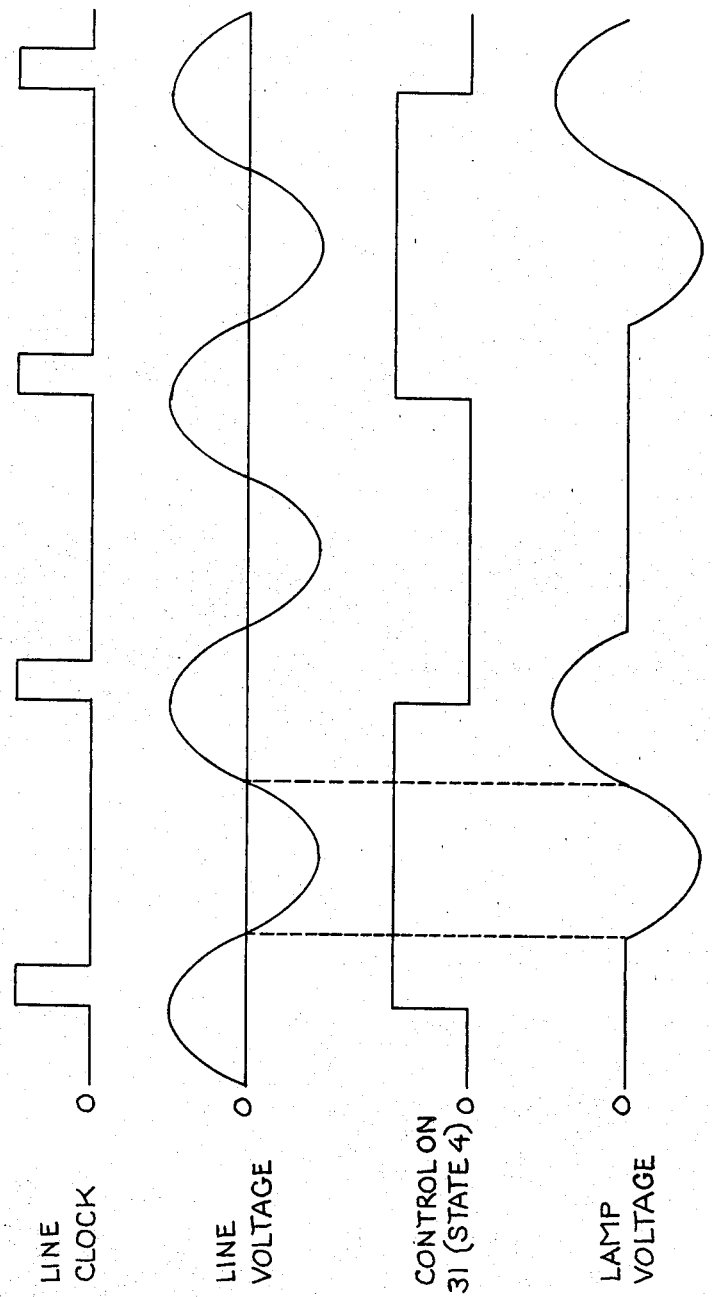
FIG. 7 illustrates the power waveforms generated in accordance with the present invention.

Referring to FIG. 7, the manner in which the solid state relay 24 responds to the control signal available on lead 31 to gate the desired integral cycles from the power source 4 to the resistance heater 3. This is shown for the condition of A/D state 4 appearing on leads 30. Thus, applicant has described an arrangement for either applying or deleting integral full cycles of power from the source to control the heating of the roller while uniformly distributing the power line cycles over a predetermined control period so that they produce the previously mentioned advantages.

It is desirable to monitor the average line current from source 4 to the resistance heater 3 and to delete cycles to reduce excessive current consumption during full power, or state 5, caused by high line voltage conditions or by an unusually low resistance of the heater 3 which would otherwise cause the heater circuit to draw excessive current and open the fuse. The over current detector 23 operates to cause the proportion selector 22 to delete alternate cycles (state 4 of FIG. 5) to reduce the current consumption during the period these undesirable conditions exist. In a particular application the current detector 23 comprises a current sensor, ie transformer 32 as shown in FIG. 8 which responds to the current flowing in the AC line from 4 to 3. Current produced by sensor 32 is rectified in full wave detector 33 and filtered in 34 to produce a signal corresponding to the average magnitude of lamp current. When this signal at the output of the low pass filter is above a predetermined level indicating excessive current, a level detector 35 responds to produce a signal over lead 36 to the OR gate 37 of the proportion selector 22 to change the state 5 signals appearing on leads 30 to a state 4. This state 4 represents the application of alternate integral cycles of power from source e4 to the resistance heater. This condition is continued until the average current from the low pass filter 34 falls below the predetermined level which indicates that the adverse conditions have passed.

The solid state relay 24 is a common device available usually as a triac switching element with an internal triggering circuit to accomplish switching at the zero crossing points of the applied voltage following changes in the control signal.

While the invention has been described with particular reference to the construction shown in the drawings, it is understood that further modification may be made without departing from the true spirit and scope of the invention, which is defined by the claims appended hereto.

What I claim as new and desire to secure by Letters Patent of the United States is:

1. An arrangement for controlling electrical current supplied from an AC source to a fusing roller in accordance with variable analog control signals representing the variations in temperature of the roller over a given range comprising means for digitizing said analog control signals to provide first control signals, means for controlling the proportion of integral cycles of alternating current from said source blocked to those supplied to said roller during a predetermined control period in which a substantial proportion of integral cycles of alternating current occur in accordance with said first control signals, means to provide a uniform spacing in time of the integral cycles supplied to said roller for all such proportions over said control period, means for indicating the average current consumed by said roller, means responsive to said indicated average current exceeding a predetermined level for providing second control signals, and means for modifying said first control signals in accordance with said second control signals.

2. An arrangement according to claim 1 wherein said first control signals are multi-bit binary signals.

3. An arrangement according to claim 1 wherein said modified first control signals vary the proportion of cycles blocked to cycles passed during said predetermined control period to lower the average current consumed by said roller below said predetermined level.

4. An arrangement for controlling electrical current supplied from an AC source to a load in accordance with variable analog control signals representing variations in a characteristic of said load over a given range comprising means for digitizing said analog control signals to provide first digital control signals, means for controlling the proportion of integral cycles of alternating current from said source blocked to those supplied to said load during a predetermined control period in which a substantial proportion of integral cycles of alternating current occur in accordance with said first digital control signals, means to provide a uniform spacing in time of the integral cycles supplied to said load for all such proportions over said control period, means for indicating the average current consumed by said load, means responsive to said indicated average current exceeding a predetermined level for providing second digital control signals, and means for modifying said first digital control signals in accordance with said second digital control signals.

5. An arrangement according to claim 4 wherein said analog signal is a DC signal, said means for digitizing comprises means for quantizing said analog control signal, said means for quantizing sensing a plurality greater than two of discrete DC signal amplitude levels to produce a corresponding plurality of discrete first digital control signals, said means for controlling responsive to said plurality of first digital control signals to produce a corresponding plurality of discrete duty cycles from said source, and said means for modifying causes said means for controlling to change production of a duty cycle to a lower duty cycle.

6. An arrangement according to claim 5 wherein said means for controlling comprises a counter for counting frequency cycles of said AC source to provide count signals, switch means for passing and blocking the application of power from said AC source to said load circuit, and means responsive to said first digital control signals for controlling the gating of desired count signals to said switch means for controlling the duty cycle of power supplied from said source to said load.

7. An arrangement for controlling electrical current supplied from an AC source to a fusing roller in accordance with variable analog control signals representing variations in the temperature of the roller over a given range comprising means for digitizing said analog control signals to provide first control signals, means for varying the proportion of integral full cycles of alternating current from said source blocked to those supplied to said roller in accordance with said first control signals during a predetermined control period in which a substantial proportion of integral full cycles of alternating current from said source occur, means for distributing the integral full cycles supplied to said roller evenly in time over said control period as the proportion of integral cycles of alternating current from said source blocked to those supplied to said roller is varied.

8. An arrangement according to claim 7 comprising means for indicating the average current consumed by said roller, means responsive to said indicated average current exceeding a predetermined level for providing second control signals, means for modifying said first control signals in accordance with said second control signals until said average current falls below said predetermined level.

* * * * *